United States Patent
Kim

(10) Patent No.: US 7,642,120 B2
(45) Date of Patent: Jan. 5, 2010

(54) CMOS IMAGE SENSOR AND MANUFACTURING METHOD THEREOF

(75) Inventor: Yeong Sil Kim, Suwon-si (KR)

(73) Assignee: Dongbu Electronics Co., Ltd., Seoul (KR)

(*) Notice: Subject to any disclaimer, the term of this patent is extended or adjusted under 35 U.S.C. 154(b) by 345 days.

(21) Appl. No.: 11/501,597

(22) Filed: Aug. 9, 2006

(65) Prior Publication Data
US 2007/0037338 A1    Feb. 15, 2007

(30) Foreign Application Priority Data
Aug. 10, 2005    (KR) .................... 10-2005-0073265

(51) Int. Cl.
*H01L 21/00* (2006.01)
(52) U.S. Cl. .................. 438/70; 438/73; 257/E31.121; 257/E31.127
(58) Field of Classification Search ................ 257/292, 257/294, 432, E31.121, E31.127; 438/69, 438/70, 73
See application file for complete search history.

(56) References Cited

U.S. PATENT DOCUMENTS

| 6,171,883 | B1 * | 1/2001 | Fan et al. ................ 438/65 |
| 6,414,343 | B1 * | 7/2002 | Kondo et al. ............. 257/294 |
| 7,125,496 | B2 * | 10/2006 | Lee ........................ 216/41 |
| 2006/0144815 | A1 * | 7/2006 | Huang ..................... 216/41 |

FOREIGN PATENT DOCUMENTS

| JP | 5-100109 | * | 4/1993 |
| JP | 1996-0118920 | | 11/1997 |
| JP | 2001-376766 | | 6/2003 |
| KR | 10-1996-0021528 | | 3/1998 |

OTHER PUBLICATIONS

English translation of JP 5-100109.*

* cited by examiner

*Primary Examiner*—M. Wilczewski
*Assistant Examiner*—Toniae M Thomas
(74) *Attorney, Agent, or Firm*—Saliwanchik, Lloyd & Saliwanchik

(57) ABSTRACT

Provided is a CMOS (complementary metal oxide semiconductor) image sensor and a manufacturing method thereof. In the method, a photodiode, an interlayer insulating layer, a color filter layer, and a planarizing layer are sequentially formed on a substrate. A photoresist is applied on the planarizing layer. The photoresist is selectively patterned to form a plurality of photoresist patterns. A surface of each photoresist is hardened. The hardened photoresist patterns are reflowed to form microlenses.

14 Claims, 3 Drawing Sheets

CMOS IMAGE SENSOR AND MANUFACTURING METHOD THEREOF

RELATED APPLICATION

This application claims the benefit, under 35 U.S.C. §119(e), of Korean Patent Application Number 10-2005-0073265 filed Aug. 10, 2005, which is incorporated herein by reference in its entirety.

FIELD OF THE INVENTION

The present invention relates to a complementary metal oxide semiconductor (CMOS) image sensor and a manufacturing method thereof.

BACKGROUND OF THE INVENTION

In general, an image sensor is a semiconductor device that converts an optical image into an electrical signal. Image sensors are largely divided into charged coupled device (CCD) image sensor devices and CMOS image sensor devices.

A CMOS image sensor includes a photodiode section that detects radiated light and a CMOS logic circuit section that processes electrical signals to provide corresponding data. The larger the amount of light received by the photodiode section is, the better the photosensitivity characteristics of the image sensor are.

FIG. 1 is a sectional view of a CMOS image sensor according to the prior art.

According to the prior art, in order to increase photosensitivity, either the fill factor of a photodiode 11 region formed on a substrate 10 is increased, or a path of light incident to other regions outside the photodiode 11 is changed so that the light can be condensed to the photodiode 11.

A representative example of the light condensing technology is the use of microlenses 16, which are generally formed convexly of material having excellent light transmittance above the photodiodes 11, in order to refract incident light and radiate a larger amount of light onto the photodiode 11 region.

However, during the forming of the microlenses 16 according to the prior art, the miniaturized pattern leads to overlaps (A) formed between the adjacent microlenses 16 during a reflow process, whereby the overlaps (A) diminish the efficient focusing of light.

Due to recent miniaturization of microlens for CMOS image sensors (sizes of microlenses are 5.2 μm×5.2 μm, 3.2 μm×3.2 μm, and 2.5 μm×2.5 μm, respectively for CMOS image sensors of 0.25 μm-tech, 0.18 μm-tech, and 0.13 μm-tech), it is becoming increasingly important to stably secure spaces between the microlenses.

SUMMARY OF THE INVENTION

Accordingly, the present invention is directed to a CMOS image sensor and a manufacturing method thereof that addresses and/or substantially obviates one or more problems, limitations, and/or disadvantages of the prior art.

An object of the present invention is to provide a CMOS image sensor and a manufacturing method thereof that form miniature microlenses while preventing overlaps of adjacent microlenses.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a method of manufacturing a CMOS image sensor, including: sequentially forming a photodiode, an interlayer insulating layer, a color filter layer, and a planarizing layer on a substrate; applying a photoresist on the planarizing layer; selectively patterning the photoresist and forming a plurality of photoresist patterns; hardening a surface of each photoresist pattern; and reflowing the hardened photoresist patterns for forming microlenses.

In another aspect of the present invention, there is provided a CMOS image sensor including: a substrate with a photodiode formed thereon; an interlayer insulating layer formed on the substrate including the photodiode; a color filter layer formed on the interlayer insulating layer; a planarizing layer formed on the color filter layer; a plurality of microlenses formed on the planarizing layer; and an overlap preventing material interposed between the microlenses.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 5:
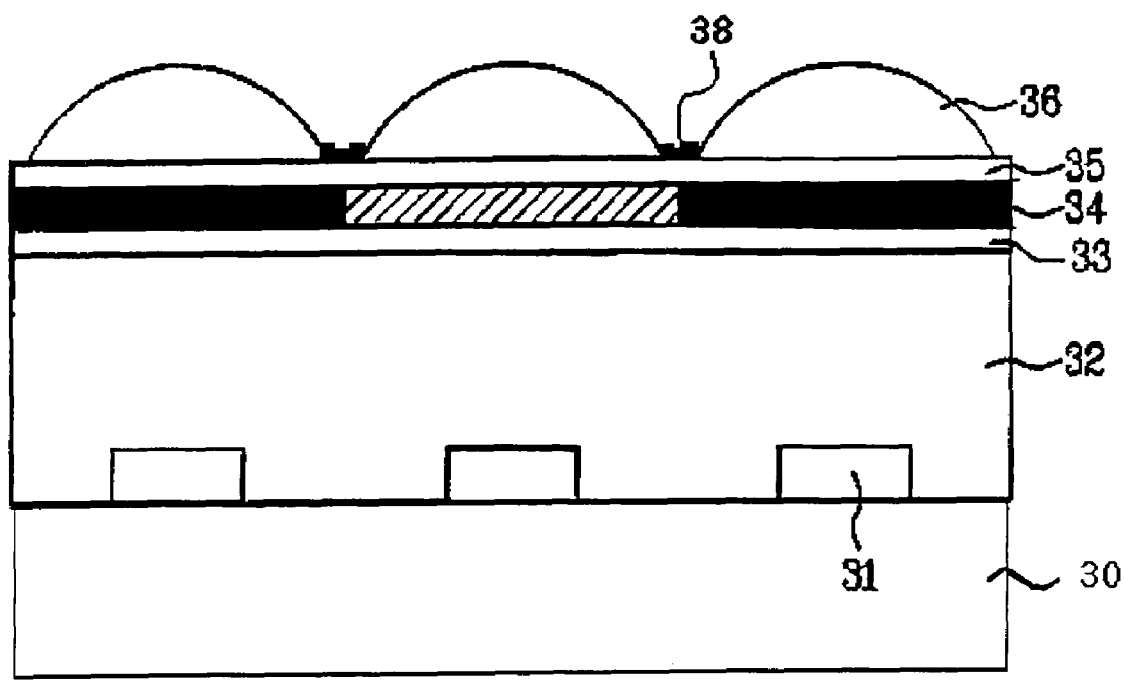

FIG. 5 is a sectional view of a CMOS image sensor according to an embodiment of the present invention.

Referring to FIG. 5, A CMOS image sensor according to an embodiment of the present invention can include a photodiode 31 formed on a substrate 30, an interlayer insulating layer 32 formed on the substrate 30 including the photodiode 31, a protective layer 33 formed on the interlayer insulating layer 32, a color filter layer 34 formed on the protective layer 33, a planarizing layer 35 formed on the color filter layer 34, and a plurality of microlenses 36 formed on the planarizing layer 35 with overlap preventing material 38 interposed between the microlenses 36.

Below, a method of manufacturing a CMOS image sensor according to embodiments of the present invention will be described with reference to FIGS. 2 through 5.

Figure 1:
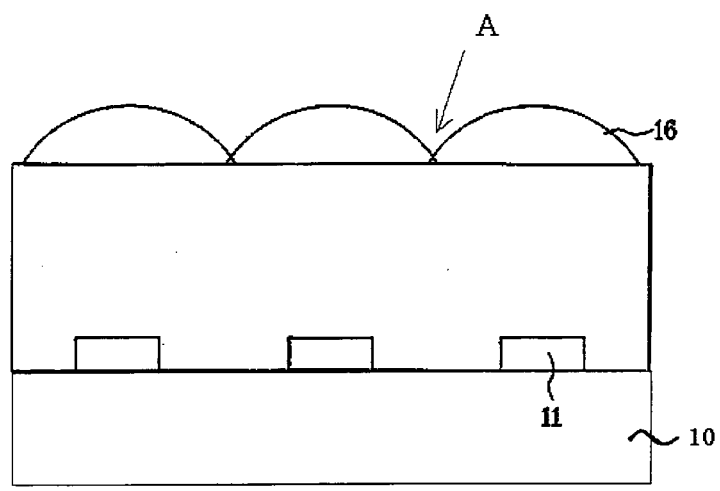
FIG. 1 is a sectional view of a CMOS image sensor according to the prior art.
Figure 2:
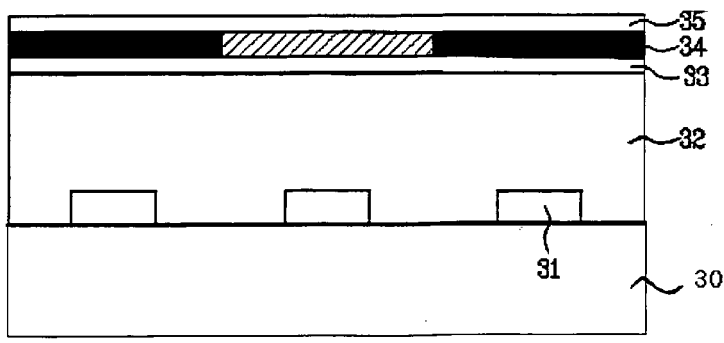
FIGS. 2 through 5 are sectional views showing stages of a manufacturing method of a CMOS image sensor, according to embodiments of the present invention.

As shown in FIG. 2, a plurality of light detecting devices such as photodiodes 31 and various transistors (not shown), can be formed on a semiconductor substrate 30. Then, an interlayer insulating layer 32 can be formed.

In another embodiment, the light detecting devices can be formed in photo gate configurations, and not photodiode 31 configurations.

In one embodiment, the interlayer insulating layer 32 can be formed in a multilayer. For example, after forming a first interlayer insulating layer (not shown), an optical shielding layer (not shown) for blocking incident light on regions other than the photodiodes 31 can be formed on the first interlayer insulating layer, after which a second interlayer insulating layer (not shown) can be formed thereon.

Next, a protective layer 33 can be formed on the interlayer insulating layer 32 to protect the device from moisture and scratching.

A dye resist can be applied on the protective layer 33, followed by exposure and developing, to form a color filter layer 34 for filtering different wavelength ranges of light.

Here, during the exposing process for forming the color filter layer 34, a mask with a defined pattern can be used as the photo mask (not shown) so that concavo-convex forms may be formed on the boundaries of the color filter layer 34.

Next, a planarized planarizing layer 35 for ensuring planarization can be formed on the color filter layer 34, in order to form an even focal length and a lens layer thereon.

Figure 3:
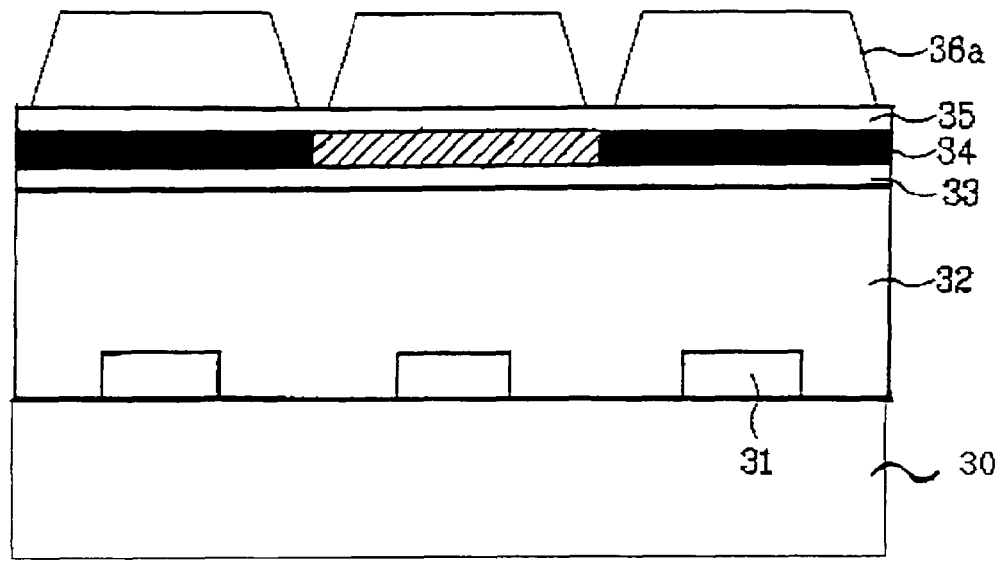

Referring to FIG. 3, a photoresist for forming the microlenses can be applied on the planarizing layer 35.

Then, the photoresist can be patterned through an exposing and developing process to form a plurality of separated photoresist patterns 36a.

Figure 4:
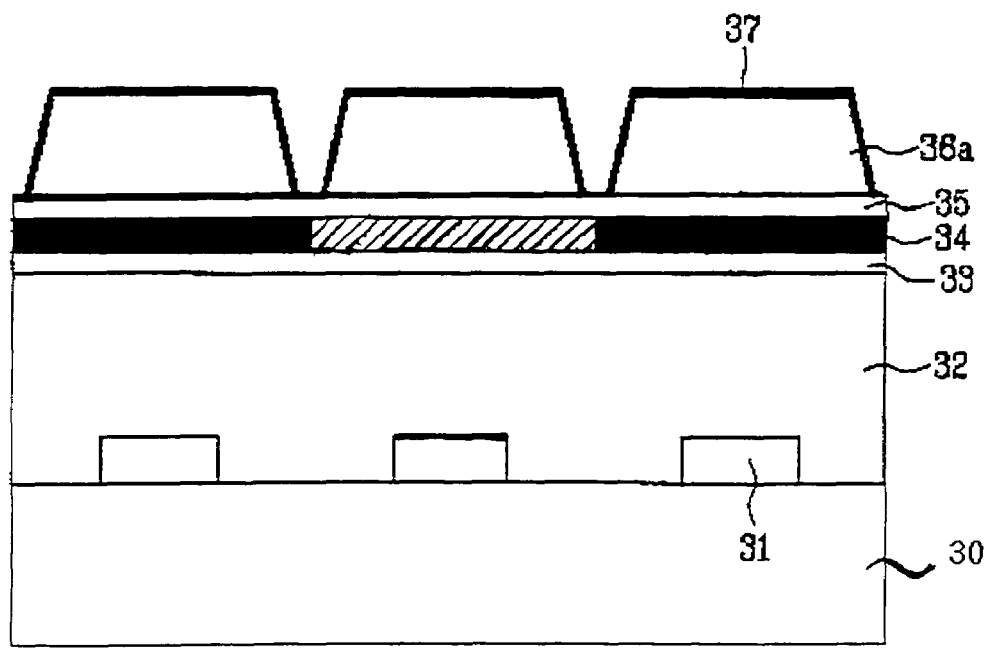

Referring to FIG. 4, the surface of each photoresist pattern 36a can be hardened. Here, the hardening of the photoresist pattern 36a surfaces can be performed through plasma processing. A polymer 37 can be formed on the surfaces of the photoresist patterns 36a through the hardening process thereof.

In an embodiment, the plasma processing for hardening the surfaces of the photoresist patterns 36a can use, for example, a $C_xF_y$-based gas including the element fluorine or a $CH_xF_y$-based gas as a polymer-forming gas, either separately or in a mixture.

The flow rates of the $C_xF_y$ and $CH_xF_y$-based gases are proportional to the polymer formation, so that an excessive amount of gas induces over-hardening of the photoresist patterns, and the use of too little gas leads to weak photoresist pattern surfaces. In a specific embodiment, 10-25 sccm of $C_5F_8$ and 2-10 sccm of $CH_2F_2$ can be used to harden the surfaces of the photoresist pattern 36a to prevent overlaps of the microlenses.

In a preferred embodiment, 18 sccm of $C_5F_8$ and 5 sccm of $CH_2F_2$ can be used to effectively harden the surfaces of the photoresist patterns 36a and prevent overlaps of the microlenses.

In a further embodiment, $O_2$ and Ar gas can be used separately or in a mixture for the plasma processing to harden the surfaces.

The function of the $O_2$ gas is to prevent over formation of polymer. There is an inverse proportion between the flow rate of $O_2$ gas and the formation of the polymer. In one embodiment, an adequate level of $O_2$ gas is approx. 0.1-10 sccm.

The function of the Ar gas is to increase plasma uniformity to ensure even formation of the polymer, or for preventing excessive polymer formation on top of the photoresist, through polymer sputtering. There is an inverse proportion between the flow rate of the Ar gas and the formation of the polymer. In one embodiment, an adequate formation of polymer can occur when the Ar gas is 50-200 sccm.

When forming the polymer, there is a correlation between pressure and power. When there is too much pressure, excessive polymer is formed on top of the photoresist, and too little pressure leads to too little polymer being formed. In one embodiment, an adequate amount of polymer can be formed with a pressure of 10-50 mT and 600-800 W of power. In a specific embodiment, 30 mT of pressure and 700 W of power can be used in the plasma processing for hardening the surface of the photoresist patterns 36a, in order to form an adequate amount of polymer to prevent overlaps of the microlenses.

Referring to FIG. 5, hemispheric microlenses 36 can be formed by reflowing the photoresist patterns 36a having hardened surfaces.

In a specific embodiment, this can be performed using a hot plate or a furnace to provide a temperature of 150-200° C. Here, the curvature of the microlenses 36 varies according to a heating method used to shrink the microlenses 36, and the focusing efficiency of the microlenses 36 varies according to the curvatures of the microlenses 36.

When the photoresist patterns 36a are reflowed, the polymer 37 that forms a hardening layer on the surface of the photoresist patterns 36a functions as a reflow stop layer for preventing excessive flow of the photoresist at the bottom of the photoresist patterns 36a between adjacent photoresist patterns 36a.

That is, the polymer 37 hardening layer formed on the surface of the photoresist patterns 36a acts as an overlap preventing material 38 between microlenses 36 during the forming of the microlenses 36.

Subsequently, ultraviolet light can be radiated onto the microlenses 36 to extend the hardening process. Here, by radiating ultraviolet light to harden the microlenses 36, the microlenses 36 are able to maintain an optimal curvature.

The above-described CMOS image sensor and the manufacturing method thereof according to the present invention first hardens photoresist patterns, and then forms hemispheric microlenses through a reflow process, in order to prevent overlaps between adjacent microlenses and solve the focusing problem inherent in the related art.

Also, miniature microlenses can be formed on the CMOS image sensor according to the present invention, to allow shrinking of product size, thereby increasing product reliability and reducing the number of manufacturing processes.

It will be apparent to those skilled in the art that various modifications and variations can be made in the present invention. Thus, it is intended that the present invention covers the modifications and variations of this invention provided they come within the scope of the appended claims and their equivalents.

The invention claimed is:

1. A method of manufacturing a CMOS (complementary metal oxide semiconductor) image sensor, the method comprising:

sequentially forming a photodiode, an interlayer insulating layer, a color filter layer, and a planarizing layer on a substrate;

applying a photoresist on the planarizing layer;

selectively patterning the photoresist and forming a plurality of photoresist patterns;

hardening a surface of each photoresist pattern; and reflowing the hardened photoresist patterns to form microlenses.

2. The method according to claim 1, wherein the hardening of the surface of each photoresist pattern is performed through plasma processing.

3. The method according to claim 1, wherein the hardening of the surface of each photoresist pattern is performed through forming a polymer on the photoresist pattern through plasma processing.

4. The method according to claim 3, wherein the plasma processing uses a $C_xF_y$-based gas including fluorine as a polymer-forming gas.

5. The method according to claim 3, wherein the plasma processing uses 10-25 sccm of a $C_5F_8$ gas as a polymer-forming gas.

6. The method according to claim 3, wherein the plasma processing uses a $CH_xF_y$-based gas including fluorine as a polymer-forming gas.

7. The method according to claim 3, wherein the plasma processing uses 2-10 sccm of a $CH_2F_2$ gas as a polymer-forming gas.

8. The method according to claim 3, wherein the plasma processing is performed with a polymer-forming gas having 0.1-10 sccm of an $O_2$ gas added thereto.

9. The method according to claim 3, wherein the plasma processing is performed with a polymer-forming gas having 50-200 sccm of an Ar gas added thereto.

10. The method according to claim 2, wherein the plasma processing is performed with a pressure of 10 -50 mT and power of 600-800 W.

11. The method according to claim 2, wherein the plasma processing is performed with a pressure of 30 mT and power of 700 W.

12. The method according to claim 1, wherein in the forming of the microlenses, overlapping between the microlenses is prevented by a presence of a hardened surface of each photoresist pattern.

13. The method according to claim 1, wherein the reflowing of the photoresist patterns is performed at 150-200° C.

14. The method according to claim 1, further comprising hardening through radiating ultraviolet light on the microlenses.

* * * * *